US010907009B1

United States Patent
Liu et al.

(10) Patent No.: US 10,907,009 B1
(45) Date of Patent: Feb. 2, 2021

(54) PREPARATION OF MODIFIED EPOXY ACRYLATES AND SOLDER RESIST CONTAINING MODIFIED EPOXY ACRYLATES

(71) Applicant: JIANGNAN UNIVERSITY, Jiangsu (CN)

(72) Inventors: Ren Liu, Jiangsu (CN); Zhiquan Li, Jiangsu (CN); Liping Zhang, Jiangsu (CN); Yangyang Xu, Jiangsu (CN)

(73) Assignee: JIANGNAN UNIVERSITY, Jiangsu ( * ) Notice: Subject to any disclaimer, the term of this patent is extended or adjusted under 35 U.S.C. 154(b) by 0 days.

(21) Appl. No.: 16/965,183

(22) PCT Filed: Feb. 11, 2018

(86) PCT No.: PCT/CN2018/076192
§ 371 (c)(1),
(2) Date: Jul. 27, 2020

(87) PCT Pub. No.: WO2019/148538
PCT Pub. Date: Aug. 8, 2019

(30) Foreign Application Priority Data

Feb. 1, 2018 (CN) .......................... 2018 1 0101259

(51) Int. Cl.
*C08G 59/17* (2006.01)
*C08G 59/42* (2006.01)
(Continued)

(52) U.S. Cl.
CPC ....... *C08G 59/1466* (2013.01); *C08G 59/145* (2013.01); *C08G 59/4215* (2013.01);
(Continued)

(58) Field of Classification Search
None
See application file for complete search history.

(56) References Cited

U.S. PATENT DOCUMENTS

2011/0160329 A1* 6/2011 Kim ..................... G03F 7/105
522/149

FOREIGN PATENT DOCUMENTS

CN         1398926 A    2/2003
CN     102164977 A    8/2011
(Continued)

OTHER PUBLICATIONS

International Search Report dated Sep. 26, 2018 for related PCT/CN2018/076192 filed Feb. 11, 2018.
Written Opinion dated Sep. 26, 2018 for related PCT/CN2019/120773 filed Feb. 11, 2018.
JianwenYang, et al., "Synthesis of Carboxylated Epoxy Acrylate and Its Application in Photographic Solder Mask Ink", Applied Chemistry, vol. 18, Issue 8, 2001, pp. 606-609.
(Continued)

*Primary Examiner* — Rachel Kahn
*Assistant Examiner* — Ha S Nguyen
(74) *Attorney, Agent, or Firm* — Enshan Hong; VLP Law Group LLP

(57) ABSTRACT

The present invention discloses modified epoxy acrylates and the solder resist containing the epoxy modified acrylates, belonging to the synthetic resin field. In this invention, modified epoxy acrylates are prepared by introducing long fatty hydrocarbon chain as the branched chain into the carboxylated epoxy acrylates. The as-prepared solder resist containing this modified epoxy acrylates maintains the excellent property of photosensitive solder resist such as good adhesion, hardness, solvent resistance and weather resistance which facilities sensitivity and alkaline development during exposure simultaneously. This has led to good water resistance, electrical insulation of the cured products. Furthermore, the cured product also shows good flexibility which improves its application in photosensitive imaging ink materials.

8 Claims, 5 Drawing Sheets

(51) Int. Cl.
  *C08G 59/14* (2006.01)
  *C09D 163/10* (2006.01)
  *C08G 59/62* (2006.01)
  *G03F 7/031* (2006.01)
  *C09J 163/10* (2006.01)

(52) U.S. Cl.
  CPC ........... *C08G 59/62* (2013.01); *C09D 163/10* (2013.01); *C09J 163/10* (2013.01); *G03F 7/031* (2013.01)

(56) References Cited

FOREIGN PATENT DOCUMENTS

| | | | |
|---|---|---|---|
| CN | 104109228 | A | 10/2014 |
| CN | 105837795 | A | 8/2016 |
| CN | 106318019 | A | 1/2017 |
| EP | 1364978 | A1 | 10/2019 |

OTHER PUBLICATIONS

Lanlan Sun, "Study on the Synthesis, Structure and Performance of Flexible Fat Side Chain Epoxy Resin", , China Excellent Master's Thesis Full-text Database Engineering Science I, Issue 9, 2008, B016-90.

Second Office Action dated Jul. 29, 2019 by State Intellectual Property Office of the PRC for related Application No. 201810101259.3.

\* cited by examiner

PREPARATION OF MODIFIED EPOXY ACRYLATES AND SOLDER RESIST CONTAINING MODIFIED EPOXY ACRYLATES

RELATED APPLICATIONS

This is a U.S. national stage of international application No. PCT/CN2018/076192 filed on Feb. 11, 2018, which claims priority from China patent application No. 201810101259.3 filed on Feb. 1, 2018, the entire content of which is incorporated herein as reference.

BACKGROUND OF THE INVENTION

1. Technical Field

The present invention relates to modified epoxy acrylates and the solder resist containing the modified epoxy acrylates, which belongs to synthesis resin field.

2. Background Art

At present, the solder used in printed circuit board is of high precision and high density. Solder resist of the liquid development type after exposure to ultraviolet light, an image can be formed by development and eventually solidified by thermal or light irradiation. But due to environmental concerns, solder resist of the liquid developer has become the main stream.

The most commonly used solder resist is carboxylate epoxy acrylate. Carboxylate epoxy acrylate as an important component of photosensitive imaging ink shows excellent thermal stability, mechanical properties dielectric property, creep resistance because its molecular structure has phenolic structure. The carboxylic acid functional group on the molecular structure makes it alkali soluble and has good development ability. But it is prone to brittle fracture during use due to the high hardness and poor flexibility of carboxylate epoxy acrylate which has greatly affected the use of materials.

At present, the main solutions to the poor flexibility of carboxylate epoxy acrylate include physical modification and chemical modification approaches. Physical modification method mainly includes the addition of some inorganic particles such as alumina particles (for example, patent CN101077956), or addition of more flexible resins such as polyurethane acrylates (for example, patent CN103666060). Chemical modification method is mainly introduction of flexible chains into the molecular chain to improve the flexibility, such as silicone modified epoxy resin to improve carboxylate epoxy acrylates (e.g., patent CN101717599) or introduction of polydiacids into the resin improve flexibility.

Although the above methods can effectively improve the flexibility of the system, there are still some problems. For instance, the physical modification doesn't not improve the flexibility of the system intrinsically and this could also cause problems regarding the miscibility and storage stability of the system. The chemical modification methods currently used mainly introduce flexible chain structures onto the main chain structure of carboxylate epoxy acrylates but the hardness and thermal resistance of the system are reduced to different degrees. This has thus reduced the application range of the material.

Therefore, it is necessary to develop a material that can effectively improve the flexibility of carboxylate epoxy acrylate and maintain the intrinsic excellent mechanical properties of materials.

SUMMARY OF THE INVENTION

Aiming at solving the above problems existing in the prior art, long aliphatic chain is introduced into the branch chain of carboxylate epoxy acrylates in this invention. The solder resist which contains the modified epoxy acrylates can ensure alkali solubility resistance, thermal properties and excellent mechanical properties and at the same time it also has a higher flexibility.

The first purpose of the invention is to provide a modified epoxy acrylate, and it is obtained from the reaction of epoxy groups from long chain epoxides with one or several carboxyl groups from the side chains of carboxylated epoxy acrylates.

In one embodiment, the long-chain epoxides have an epoxy group in one end and the other end has long chain alkanes.

In one embodiment, the long-chain epoxides have the following general formula (1)

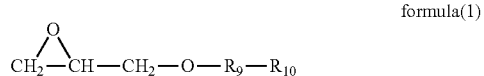

formula(1)

$R_9$ is a benzene ring or carbonyl group, and $R_{10}$ is a straight or branched and saturated or unsaturated alkane chain with 5-20 carbon atoms.

In one embodiment, the long-chain epoxides preferably have a straight-chain unsaturated hydrocarbon or glycidic tertiary carbonate and especially preferably cardanol glycidyl ether. Cardanol glycidyl ether as a biobased raw material, its price is low which is in line with the requirements of green and sustainable development. The molecular chain structure of cardanol glycidyl ether contains benzene ring and epoxy group and long unsaturated fatty chains and so it has both the properties of epoxides and the flexibility of aliphatic compounds.

In one embodiment, the weights of the long-chain epoxides and carboxylated epoxy acrylates are respectively 0.5-10 parts and 100 parts respectively; Among them, 1.5-4.5 parts of long-chain epoxides are preferred.

In one embodiment, the structural formula of the modified epoxy acrylate is shown in Equation (2)

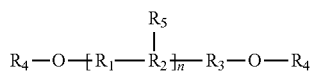

formula (2)

where
R1 is —CH2- or

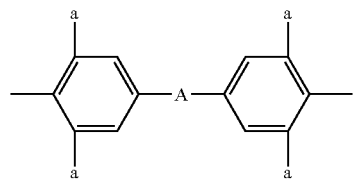

one of them, and a is —H or —Br.
R2 is

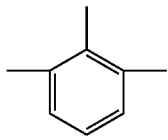 or —O—CH₂—CH—CH₂—O—, and a is —H or —Br.
R3 is

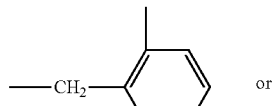 or

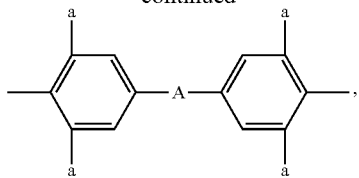

and a is —H or —Br.
R4 is

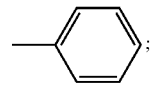

R5 is R4 or R6.
R6 is

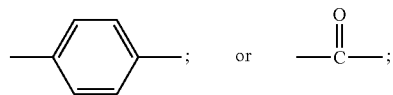

R7 is —CH3 or —H or

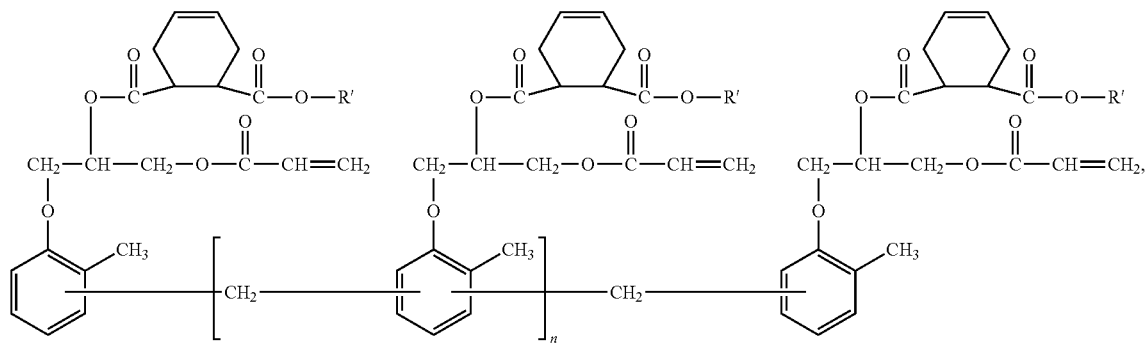;

R8 is —CH3 or —H;
R9 is

—⟨phenyl⟩—; or —C(=O)—;

X is the residue group of anhydride;
R10 is a straight or branched saturated or unsaturated alkane chain with a carbon number of 5-20;
In one embodiment,

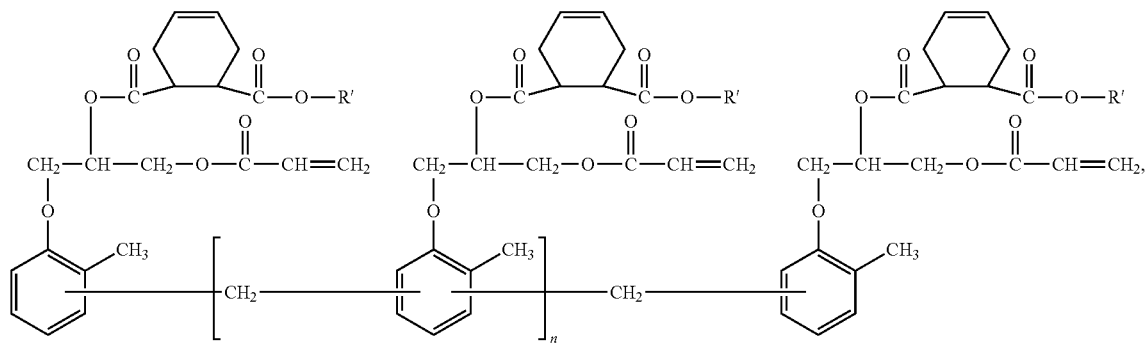

where n is 0-4.

In an embodiment, the carboxylated epoxy acrylate consists mainly of an epoxy resin, a monobasic unsaturated acid, and a polybasic anhydride.

In one embodiment, the carboxylated epoxy acrylate (hydrogenated) is bisphenol A epoxy resin and bisphenol S epoxy resin, bisphenol F type, phenol phenolic epoxy resin or o-cresol phenolic epoxy resin.

In one embodiment, the epoxy resin used in the preparation of the carboxylated epoxy acrylate is an epoxy resin with a high melting point epoxy resin. Optionally, the high melting point means a melting point higher than 80° C.

In one embodiment, the high melting point epoxy resin may have a biphenyl structure, a phenylene structure, and sulfur ether etc. crystalline epoxy resin.

In one embodiment, the high melting point epoxy resin is an o-cresol epoxy resin with a biphenyl structure.

In one embodiment, the epoxy resin may be bisphenol epoxy resin, such as bisphenol A, tetrabromobisphenol A, bisphenol F, bisphenol S etc. It can also be alicyclic epoxy resin, such as hydrogenated bisphenol A; Phenol-phenolic epoxy resin or cresol phenolic epoxy resin; Through phenol, o-cresol, m-cresol, naphthol and other phenolic compounds with phenolic hydroxyl, the polyphenolic compound and the reactant with epichlorohydrin obtained by the condensation reaction of the aromatic aldehyde etc.

In one embodiment, the mono-unsaturated acid has one carboxyl group and at least one unsaturated double bond for radical polymerization. For example, acrylic acid, methacrylic acid, cromaric acid, cinnamic acid, beta-acryloyloxy propionic acid, products from (meth)acrylate hydroxyl ester having a hydroxyl group and a (methyl) acrylyl group and a bibasic anhydride, a polyfunctional (methyl) acrylate and diacid having one hydroxyl group and more than two (methyl) acrylates, one or more of the products of anhydride and modified caprolactone etc., one or more of them may be used. Among them, an unsaturated mono-acid with (methyl) acryloyl such as acrylic acid and methacrylic acid etc. is preferred.

In one embodiment, the monounsaturated acid is acrylic acid and/or methacrylic acid where 1 equivalent epoxy groups consume 1.0 moles of unsaturated mono-acid.

The synthesis reaction of epoxy acrylate (before reaction with polyanhydride) in the present invention may be: epoxidation synthesis by adding unsaturated mono-acid and unsaturated mono-acid together; epoxides are added first and unsaturated mono-acids are added in batches method etc.

Here, the carboxyl group in an unsaturated monocarboxylic acid over the epoxy group in a 1 equivalent epoxides is preferred to be 0.8-1.2.

The conditions for the synthesis of epoxy acrylates are not specifically defined, in the presence or absence of the solvent as well as diluent, in the coexistence of hydroquinone and oxygen as polymerization inhibitors, and trimethylamine as tertiary amine, triethyl benzyl chloride as quaternary ammonium salt, imidazole compound of 2-ethyl4-methyl-imidazole, tert-phosphine of triphenylphosphine and benzyl triphenyl bromide Quaternary phosphines, such as phosphines, organic acids or inorganic salts of metals, or chelates, etc. The reaction can take place usually at 80-150° C.

The epoxy acrylate obtained by the above process has an alcohol-hydroxyl group by ring opening reaction of an epoxy group in epoxide and carboxyl group in saturated mono-acid. By the addition of polyanhydride to these hydroxyl groups the carboxylate epoxy acrylate which can be used in the invention can be obtained by introducing the carboxylic group.

Polyanhydride may include dianhydride such as phthalic anhydride, succinic anhydride, octenyl succinic anhydride, pentasuccinic anhydride, maleic anhydride, tetrahydrophthalic anhydride, hexahydrophthalic anhydride, methyl tetrahydride Phthalic anhydride, 3, 6-methylenetetramethylphthalic anhydride, methylenetetramethylphthalic anhydride, tebromophthalic anhydride, 9, 10-dihydro-9-oxyhetero-10-phosphohetero-10-oxide, and the reactants of itaconic anhydride or maleic anhydride; trimellitic anhydride; aliphatic or aromatic tetracylic anhydride, such as diphenyltetracylic anhydride, naphthyltetracylic anhydride, diphenyl ether tetracylic dianhydride, butane tetracarboxylic anhydride, cyclopentane tetracarboxylic anhydride, phthalic anhydride, dibenzophenone tetracarboxylic anhydride, etc. One or more of them can be used.

In one embodiment, the polyanhydride is an alicyclic dianhydride, in which the 1 equivalent tertiary hydroxyl of the epoxy resin modified by unsaturated mono-acid is reacted with 0.5-0.6 mole of the polyanhydride to obtain the carboxylate epoxy acrylates.

In one embodiment, the acid value of the carboxylate epoxy acrylate is above 30 mgKOH/g, and a better lower limit is 50 mgKOH/g. In addition, the preferred upper limit is 150 mg KOH/g, and the more preferred upper limit is 120 mg KOH/g.

In one embodiment, the mass of the epoxides is preferred to be 0-0.06 g over that of the carboxylate epoxy acrylate of 1 g.

In one embodiment, R9 acts as a carbonyl group, and the compounds listed are glycidyl esters. Among them, glycidyl tert-carbonate is the best, because the raw materials are easy to be obtained and the application to industrial production is relatively simple.

The second purpose of the present invention is to provide a solder resist containing modified epoxy acrylate of the present invention.

In one embodiment, the solder resist also contains a photo-polymerization initiator, a filler, a diluent, an additive, a solvent, etc.

In one embodiment, the photopolymerization initiator may use a known photopolymerization initiator, and benzoin and its alkyl ether classes, such as benzoin, benzoin methyl ether, benzoin ethyl ether, etc.; Acetyl benzene, such as acetyl benzene, 2, 2-dimethoxy2-phenyl acetyl benzene, 1, 1-dichloroacetyl benzene, 4-(1-tert-butyl dihydroxy-1-methylethyl) acetyl benzene; Anthraquinones, such as 2-methylanthraquinone, 2-pentyl anthraquinone, 2-tert-butyl anthraquinone, 1-chloro-anthraquinone; Thiotons ketones, such as 2, 4-dimethyl thiotons ketone, 2, 4-diisopropyl thiotons ketone, 2-chlorothiotons ketone, etc. Keto, such as acetyl benzyl dimethyl keto, benzyl dimethyl keto, etc. Dibenzophenone, such as dibenzophenone, 4-(1-tert-butyldihydroxy-1-methylethyl) dibenzophenone, 3,3', 4, 4'-(tert-butyldihydroxy-carbonyl) dibenzophenone, etc.

In one embodiment, photopolymerization initiator may preferred to be α-amino phenyl ethyl ketones, such as 2-methyl-1-[4-(methyl sulfide) phenyl]-2-morpholine acetone-1, 2-amino-1-2-dimethyl benzyl-(4-phenyl) morpholine-ketone of butane-1-, 2-(dimethyl amine)-2-[(4-methyl phenyl) methyl] 1-[4-(4-morpholine) phenyl]-1-butyl ketone, N, N-dimethyl amine acetophenone, etc.; Acylphosphine oxides, such as 2, 4, 6-trimethylbenzoyl diphenylphosphine oxide, bis (2, 4, 6-trimethylbenzoyl)-phenylphosphine oxide, bis (2, 6-dimethoxybenzoyl)-2, 4, 4-trimethyl-pentylphosphine oxygenate.

In one embodiment, the amount of photoinitiator used was 0.01 to 5 parts, preferably 1 to 3 parts, with 100 parts of the resin solids.

In one embodiment, the amount of diluent used was 0 to 100 parts of the resin (carboxylate epoxy acrylates), preferably 10 to 30 parts.

Solvents may be organic solvents, including ketones, aromatic hydrocarbons, dialcohol ethers, dialcohol ethers acetate, esters, mixed diesters, alcohols, aliphatic hydrocarbons, petroleum solvents, etc. More specifically, there are ketones such as methylketone and cyclohexanone; Aromatic hydrocarbons such as toluene, xylene and tetratoluene; Fibrinolytic agent, methyl fibrinolytic agent, butyl fibrinolytic agent, carbitol, methyl carbitol, butyl carbitol, propylene glycol monomethyl ether, dipropylene glycol monomethyl ether, dipropylene glycol diethyl ether, triethylene glycol monomethyl ether and other dialcohol ether; Ethyl acetate, butyl acetate, dipropylene glycol methyl ether acetate, propylene glycol ethyl ether acetate, propylene glycol butyl ether acetate, and other esters; Ethanol, propanol, ethylene glycol, propanediol and other alcohols; Aliphatic hydrocarbons such as octane and decane; Petroleum ether, naphtha, hydrogenated naphtha, solvent naphtha and other petroleum solvents. Such organic solvents may be used alone or as mixtures of more than two.

In one embodiment, the dosage of the solvent used was 0-60 parts, preferably 10-40 parts, as opposed to 100 parts of the resin solids.

In one embodiment, the solder resist is also supplemented with any other additive known to the public, such as talc, clay, barium sulfate, silica filler, coloring pigment, defoamer, coupling agent, leveling agent, sensitizer, release agent, lubricant, plasticizer, antioxidant, UV absorbent, flame retardant, polymerization inhibitor, viscosifier, etc. The additive is one of the known additives. In one embodiment, the amount of additive used was 0-10 as opposed to 100 parts of the resin composition 10 parts, preferably 1-5 parts.

In one embodiment, the solder resist is prepared as follows. The organic solvent in present invention is used to adjust the viscosity of coating, by the dip-coating method, flow coating method, roller coating method, scraping rod coating, screen printing, curtain coating methods such as coating to the substrate, at about 60-100° C. temperature makes the combination contains organic solvent evaporation drying (drying temporarily), which makes the coating non-sticky. In addition, the composition is coated on the carrier film, dried and formed into a film, and the material formed by rolling up the film is attached to the base material to form a resin insulating layer. After that, contact (or non-contact) mode is adopted to form a pattern-shaped optical mask, and the active energy ray is selectively exposed or the pattern is directly exposed by a laser direct exposure machine. The unexposed part is developed by dilute alkali water solution (such as 0.3-3 wt % sodium carbonate solution) to form an anti-corrosion pattern.

The third purpose of the invention is to provide a photocuring coating, adhesive, photoresist, coating or printed circuit board containing the modified epoxy acrylate of the invention.

Advantages and Effects of the Invention

1) While improving the flexibility of the material, the invention can also maintain the original excellent mechanical properties of the material and well balance the heat resistance and flexibility of the material.

The solder resist containing the modified epoxy acrylate of the invention maintains good adhesion, hardness, solvent resistance, water resistance, electrical insulation and weather resistance of the photosensitive solder resist ink, so that the sensitivity and alkaline development can coexist when exposed; at the same time, it also gives the material better flexibility after light curing, and improves its resolution and comprehensive performance in the photosensitive imaging ink.

BRIEF DESCRIPTION OF THE DRAWINGS

FIG. 4 is a reaction principle diagram of example 1, wherein,

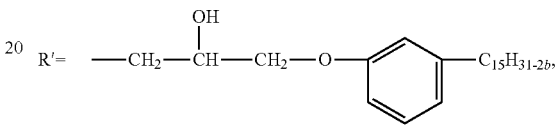

and b=0, 1, 2 or 3 and the R group can be

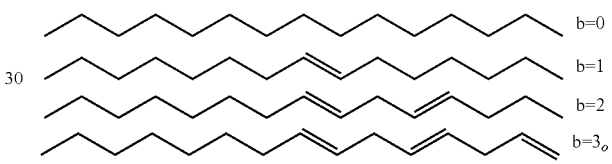

Figure 5:
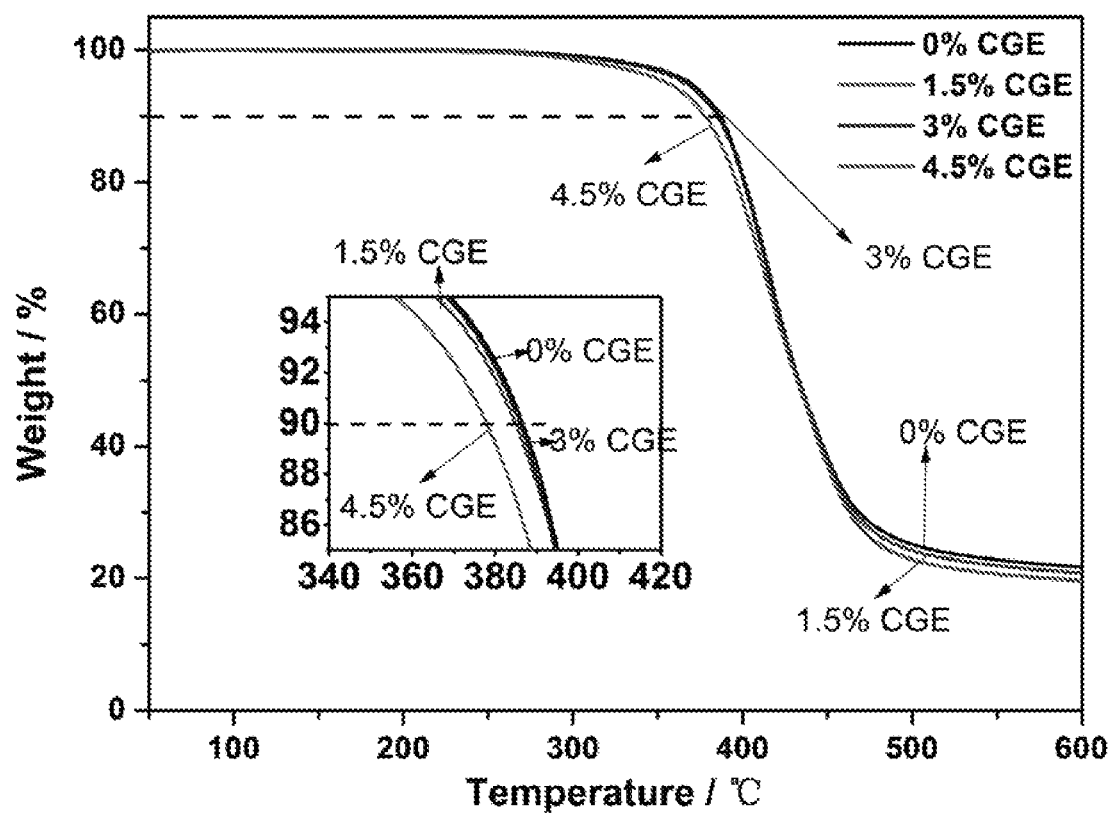

FIG. 5 shows the thermogravimetric curves of EATC with different cardanol contents.

DESCRIPTION OF PREFERRED EMBODIMENTS

The embodiments of the present application are described in detail below.

Example 1: Synthesis of Modified Epoxy Acrylate (1) Synthesis of Epoxy Acrylate (EA)
1 036.48 g of o-cresol epoxy resin, 4.9 g of triphenylphosphine (TPP) and 0.8 g of p-hydroxyanisole were added into a 500 ml three port flask, and the temperature was raised to 95° C. Add 90 g of acrylic acid and exothermic process proceeds at ambient conditions. Wait for the end of exothermic process, and then heat up to 108° C. for 2 hours. Add a certain amount of acrylic acid and polymerization inhibitor, and heat up to 115° C. for 3 hours. Add a certain amount of acrylic acid and keep the temperature at 115° C. until the final acid value is less than 1;

(2) Synthesis of Carboxylated Epoxy Acrylate (Anhydride Modified Epoxy Acrylate) (EAT)
Add 199 g high boiling point solvent to mix binary ester (DBE) and cool to 95° C. 1.04 g of polymerization inhibitor p-hydroxyanisole and 315.68 g of tetrahydrophthalic anhydride were added into a 500 mL three neck flask and it is kept at 100° C. for 2 hours. Then the temperature was raised to 108° C. until the acid value of the end point was 67.1;

(3) Synthesis of 3 wt % Cardanol Glycidyl Ether Modified Carboxylated Epoxy Acrylate (EATC);
115.2 g high boiling point solvent mixed binary ester (DBE) and 184.96 g solvent tetratoluene were added. 0.942 g of triphenylphosphine (TPP), 0.85 g of p-hydroxyanisole and 1.016 g of hydroquinone were added into a 500 ml three port flask. When the temperature of the system was raised to 95° C., 61.203 g of cardanol glycidyl ether was added within 3 hours. Then the temperature of the system was raised to 108° C. for 2 hours, and the acid value was recorded. The temperature of the system was raised to 115° C., and the solvent B112 (mixed binary ester DBE) with mass of 59.98 g was added until the acid value of the system reached the end point of 48.

(—OH) at 3.7 ppm, and the disappearance of the proton peak of epoxy group at 2.7-2.9 ppm on EP indicates the successful synthesis of epoxy acrylate. The double bond peak of EATC was obviously enhanced by NMR integration, which indicated that the synthesis of EA modified by cardanol glycidyl ether was successful.

Figure 3:
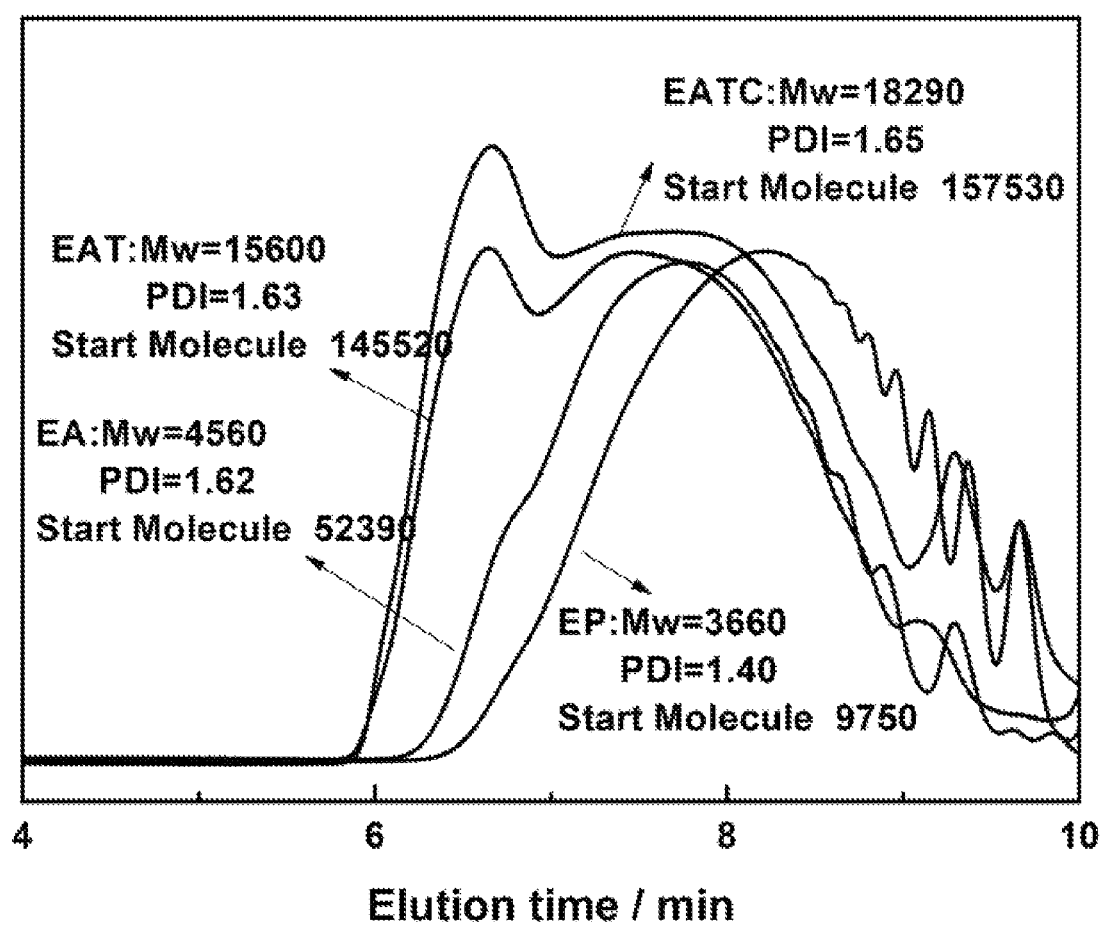
FIG. 3 shows the GPC diagram of EATC system.
Figure 4:
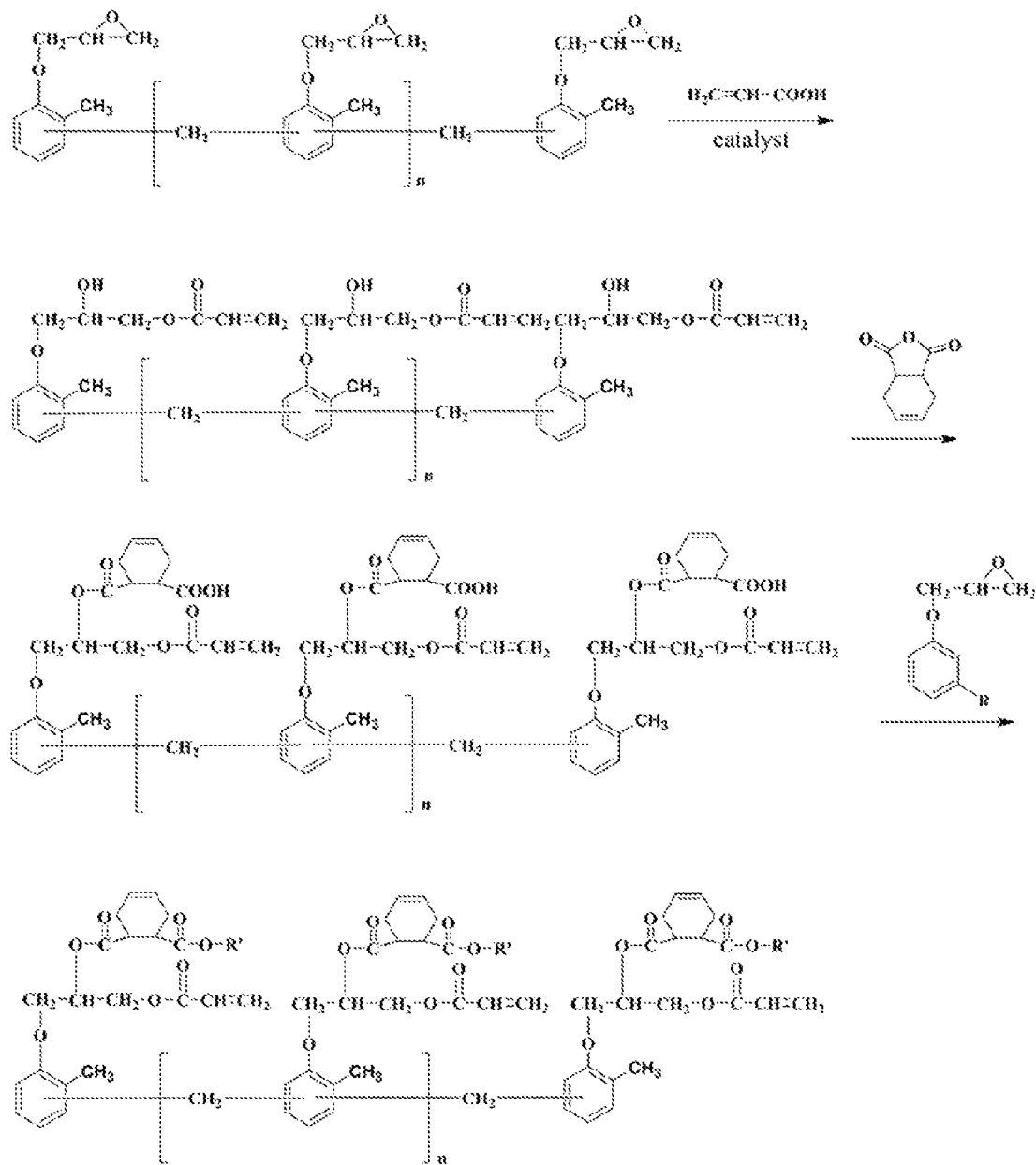

It can be seen from FIG. 3 that the molecular weight of the system gradually increases with the reaction, which proves the successful synthesis of each system.

Figure 1:
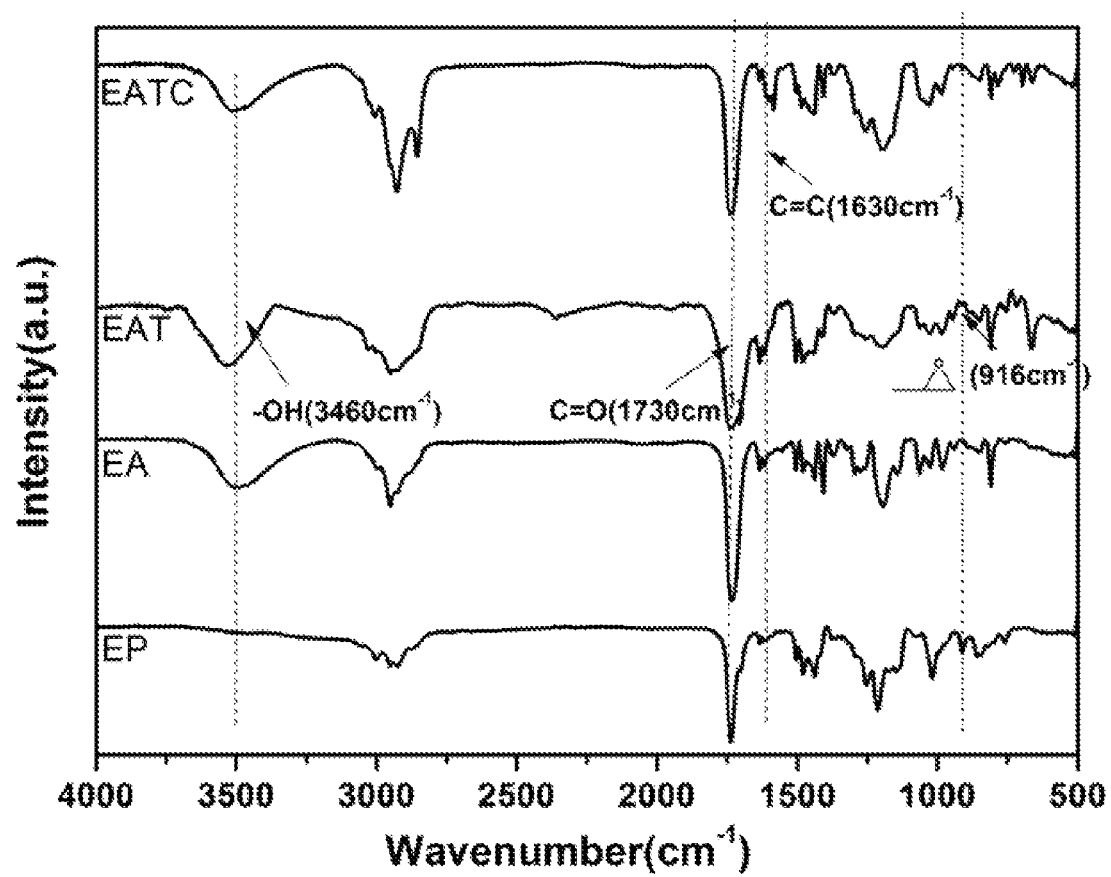
FIG. 1 shows the infrared spectra of EATC system.
Figure 2:
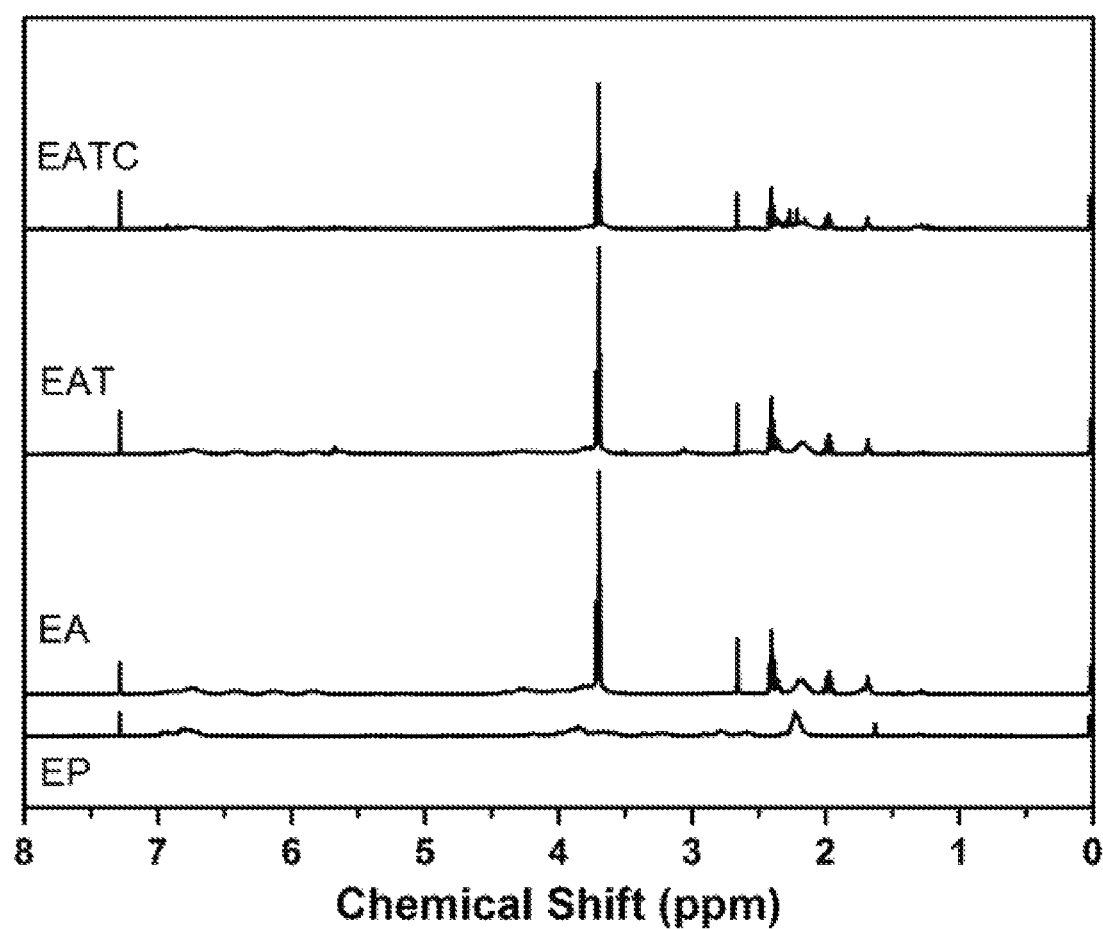
FIG. 2 shows the NMR spectra of EATC system.

According to the structure confirmation of FIGS. 1-3, the following compounds were synthesized:

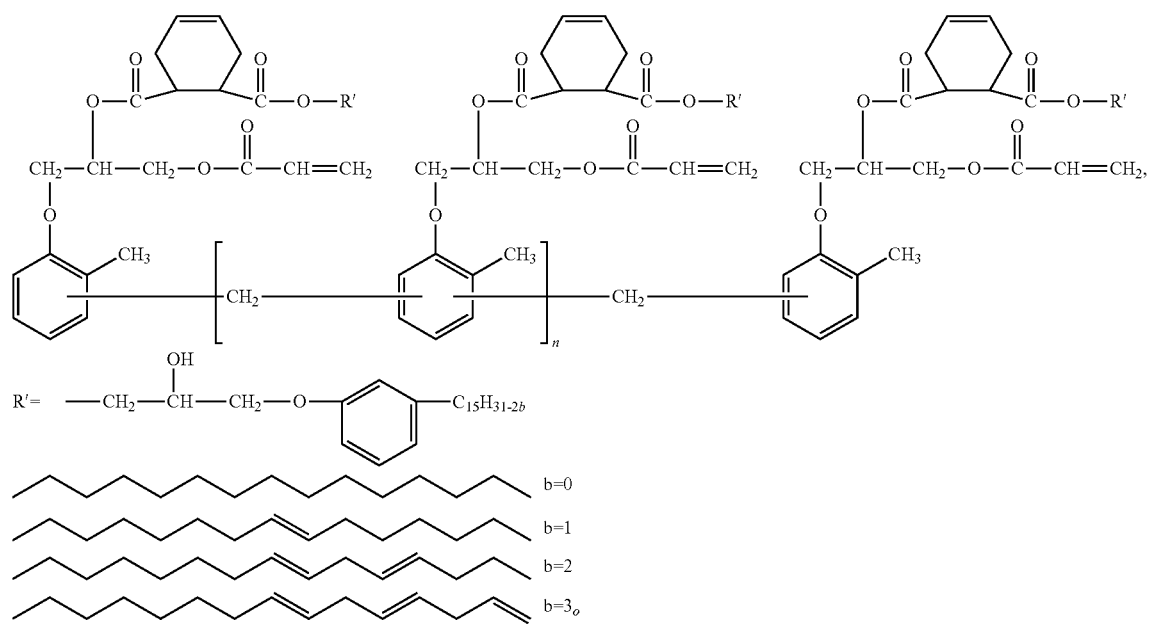

As shown in FIG. 1, EP represents epoxy resin and EA represents epoxy acrylate (it can be seen from the figure that the characteristic epoxy group of epoxy resin at 915 cm-1 has disappeared, the absorption peak at 1630 cm-1 represents the skeleton stretching vibration of unsaturated carbon double bond, the absorption peak at 810 cm-1 reflects the bending vibration characteristic absorption peak of =CH, and in addition, the absorption peak at 3460 cm-1 represents the bending vibration characteristic absorption peak of =CH Strong characteristic absorption peaks of hydroxyl groups were also observed, which proved that epoxy resin had been converted into epoxy resin acrylate.

EAT represents anhydride modified epoxy acrylate (carboxylated epoxy acrylate) (the enhancement of carbonyl absorption peak at 1730 cm-1 and the weakening of hydroxyl characteristic absorption peak at 3460 cm-1 all prove the success of EAT synthesis).

EATC represents cardanol glycidyl ether modified acid modified epoxy acrylate, (it can be seen from the figure that the enhancement of skeleton stretching vibration absorption peak of unsaturated carbon carbon double bond at 1630 cm-1 and the enhancement of characteristic absorption peak of hydroxyl group at 3460 cm-1 prove the synthesis of target product.)

It can be seen from FIG. 2 that the proton peaks of double bond (—CH=CH—) on EA at 5.6-6.5 ppm, hydroxyl Example 2: Synthesis of Modified Epoxy Acrylate (1) Synthesis of Epoxy Acrylate 1036.48 g of o-cresol epoxy resin, 4.9 g of triphenylphosphine (TPP) and 0.8 g of p-hydroxyanisole were added into a 500 ml three neck flask, and the temperature was raised to 95° C. Add 90 g acrylic acid, let the exothermic reaction proceeds at ambient conditions, and heat up to 108° C. after exothermic stage, and keep the temperature for 2 hours. Add a certain amount of acrylic acid and polymerization inhibitor, and heat up to 115° C. for 3 hours. Add a certain amount of acrylic acid and keep the temperature at 115° C. until the end acid value is less than 1;

(2) Synthesis of Carboxylated Epoxy Acrylates (Epoxide Acrylates Modified by Anhydride)

Add 199 g high boiling point solvent to mix binary ester (DBE) and cool to 95° C. 1.04 g of p-hydroxyanisole and 365.18 g of tetrahydrophthalic anhydride were added into a 500 ml three port flask and kept at 100° C. for 2 hours. Then the temperature was raised to 108° C. and the acid value was 74.28;

(3) Synthesis of 5 wt % Cardanol Modified Epoxy Acrylate 118.34 g high boiling point solvent mixed binary ester (DBE) and 190 g solvent tetratoluene, 1.884 g of triphenylphosphine (TPP), 1.7 g of p-hydroxyanisole and 1.032 g of hydroquinone were added into a 500 ml three neck flask.

Increase the temperature of the system to 95° C., 128 g of cardanol glycidyl ether (CGE) was added within 3 hours. Then the temperature of the system was raised to 108° C. for 2 hours, and the acid value was recorded. The temperature of the system was raised to 115° C. and 126.88 g of B112 was added until the acid value of the system reached the end point of 48.

Epoxy acrylate was prepared by reaction of o-cresol epoxy resin with acrylic acid, then carboxylated epoxy acrylate was obtained by anhydride modification, and then the target product was obtained by cardanol glycidyl ether modification. Specifically, the epoxy group in o-cresol epoxy resin and the carboxyl group in acrylic acid take place epoxy ring opening reaction under the action of catalyst to obtain hydroxyl group. The hydroxyl group obtained from the reaction reacts with anhydride to obtain carboxyl group at a certain temperature. The generated carboxyl group reacts with the epoxy group on cardanol glycidyl ether to obtain the target product. The structure of the target product was confirmed by FTIR, NMR and GPC.

Example 3: Synthesis of Modified Epoxy Acrylate (1) Synthesis of Epoxy Acrylate 1 036.48 g of o-cresol epoxy resin, 4.9 g of triphenylphosphine (TPP) and 0.8 g of p-hydroxyanisole were added into a 500 ml three port flask, and the temperature was raised to 95° C. Add 90 g acrylic acid, heat naturally, and heat up to 108° C. after exothermic treatment, and keep the temperature for 2 hours. Add a certain amount of acrylic acid and polymerization inhibitor, and heat up to 115° C. for 3 hours. Add a certain amount of acrylic acid and keep the temperature at 115° C. until the end acid value is less than 1;

(2) Synthesis of Carboxylated Epoxy Acrylate (Anhydride Modified Epoxy Acrylate)

Add 199 g high boiling point solvent to mix binary ester (DBE) and cool to 95° C. 1.04 g of p-hydroxyanisole and 365.18 g of tetrahydrophthalic anhydride were added into a 500 ml three port flask and kept at 100° C. for 2 hours. Then the temperature was raised to 108° C. and the acid value was 74.28;

3) Synthesis of 3 wt % Glycidyl Tert-Carbonate Modified Epoxy Acrylate

Add 118.34 g high boiling point solvent mixed binary ester (DBE) and 190 g solvent tetratoluene 1.884 g of triphenylphosphine (TPP), 1.7 g of p-hydroxyanisole and 1.032 g of hydroquinone were added into a 500 ml three neck flask. When the temperature of the system was raised to 95° C., 132 g of glycidyl tert-carbonate was added dropwise within 3 hours. Then the temperature of the system was raised to 108° C. for 2 hours, and the acid value was recorded. The temperature of the system was raised to 115° C. and 126.88 g of B112 was added until the acid value of the system reached the end point of 48.

The epoxy group of o-cresol epoxy resin and the carboxyl group of acrylic acid reacts to obtain hydroxyl group through epoxy ring opening reaction under the action of catalyst. The hydroxyl group obtained from the reaction reacts with anhydride at a certain temperature to obtain carboxyl group. The generated carboxyl group reacts with the epoxy group on glycidyl tert-carbonate to obtain the target product. The structure of the target product was confirmed by FTIR, NMR and GPC.

Example 4: Synthesis of Modified Epoxy Acrylate (1) Synthesis of Epoxy Acrylate 1036.48 g of o-cresol epoxy resin, 4.9 g of triphenylphosphine (TPP) and 0.8 g of p-hydroxyanisole were added into a 500 ml three port flask, and the temperature was raised to 95° C. Add 90 g acrylic acid, and the exothermic reaction proceeds at ambient conditions. Heat up to 108° C. after exothermic process and keep the temperature for 2 hours. Add a certain amount of acrylic acid and polymerization inhibitor, and heat up to 115° C. for 3 hours. Add a certain amount of acrylic acid and keep the temperature at 115° C. until the end acid value is less than 1;

(2) Synthesis of Carboxylated Epoxy Acrylate (Anhydride Modified Epoxy Acrylate)

Add 199 G high boiling point solvent to mix binary ester (DBE) and cool to 95° C. 1.04 g of polymerization inhibitor p-hydroxyanisole and 315.68 g of tetrahydrophthalic anhydride were added into a 500 ml three port flask and kept at 100° C. for 2 hours. Then the temperature was raised to 108° C. until the acid value of the end point was 67.1;

(3) Synthesis of 5 wt % Glycidyl Tert-Carbonate Modified Epoxy Acrylate 115.2 g high boiling point solvent mixed binary ester (DBE) and 184.96 g solvent tetratoluene were added. 0.942 g of triphenylphosphine (TPP), 0.85 g of p-hydroxyanisole and 1.016 g of hydroquinone were added into a 500 ml three port flask. When the temperature of the system was raised to 95° C., 65.34 g of glycidyl TERT carbonate was added dropwise within 3 hours. Then the system temperature was raised to 108° C. for 102 hours, and the acid value was recorded. The temperature of the system was raised to 115° C., and 59.98 g solvent (mixed binary ester DBE) was added until the acid value of the system reached the end point of 48.

The reaction principle is different from that of example 1, example 2 and example 3 (example 4)

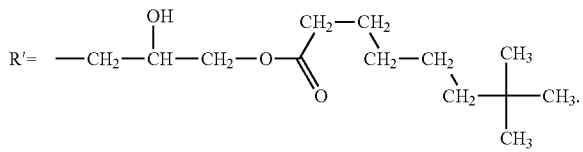

Example 5 UV Curing Coating

1: Preparation Method

Preparation of modified epoxy acrylate coating: add proper amount of photoinitiator, auxiliary and diluent into the modified epoxy acrylate prepared in the above examples, and apply it to the specification of 120*50*0.28 mm by scraping standard tinplate, and then use the hot air circulation drying oven to dry the film, and finally use the UV exposure machine to irradiate the above film for 10 s to obtain the corresponding UV curing coating (the formula is shown in Table 1).

TABLE 1 formulation of UV curing coating

| components | Modified epoxy acrylate | Diluent | Photoinitiator | Auxiliaries |
|---|---|---|---|---|
| Weight ratio (wt %) | 65 | 30 | 4 | 1 |

2. Performance Characterization of Modified Epoxy Acrylate Coating

1. Pencil Hardness

Press the B-9H pencil with the sharpened tip of pencil on the corresponding coating at an angle of about 45° and record the hardness of the pencil without film peeling.

2. Adhesion Test

A 10*10 cut mark on the paint film by the blade forms a small square, and the cut mark shall penetrate the paint film to the substrate. Tear and pull with 3M tape, and observe the paint film falling off with magnifying glass. If the paint film does not fall off the square, it is qualified. According to the area of paint film falling off, the adhesion is compared.

3. Impact Strength

The film on the substrate may deform under the action of high-speed gravity, but the film will not crack and fall off. It reflects the flexibility of the tested film and the adhesion to the substrate. The maximum height at which a certain mass of heavy hammer falls on the film template to make the film undergo elongation and deformation without causing damage. The product of the weight and the height is used to express the impact strength of the film, which is usually expressed in kg·cm.

4. Glass Transition Temperature

After curing, the coating is dried at 100° C. for 2 hours in a hot air circulation drying oven. After cooling to room temperature, the glass transition temperature of the evaluation sample was determined by DMA method.

5. Tensile Strength Test

The tensile modulus, tensile strength (tensile failure strength) and elongation at break of the above evaluation samples were measured by a tensile compression testing machine. The thickness of each specimen was measured as 4 mm in the middle. The tensile test was carried out on the cured film, and the elongation at break data were shown in Table 2. Among them: test rate: 5 mm/min, test temperature: 20° C.

6. Bending Resistance

180° bending was conducted with the curing film at the outer side, and the bending resistance times were taken as the evaluation criteria. That is, after bending once without damage, it is OT.

7. Flexibility

The paint film shall be prepared on the tinplate according to the regulations of GB1727. Unless otherwise specified, the test shall be carried out according to the constant temperature and humidity conditions specified in GB1727. The paint film of the test plate shall be upward with both hands and pressed tightly on the shaft bar with the specified diameter. The test plate shall be bent around the axial bar with the force of two thumbs within 2-3 s. After bending, the two thumb fingers shall be symmetrical to the center line of the axle bar. After bending, observe the paint film with 4 times magnifying glass. Check the paint film to see if there are cracks and spalling, and record the undamaged bending radius/mm.

TABLE 2 performance comparison of modified epoxy acrylate coatings.

| | Example 1 | Example 2 | Example 3 | Example 4 | Control |
|---|---|---|---|---|---|
| Pencile/H hardness | 3 | 3 | 3 | 3 | 4 |
| Adhesion Test/grade | 0 | 0 | 0 | 0 | 2 |
| Impact strength/cm | >100 | >100 | >100 | >100 | 40 |
| Tg/° C. | 125 | 124 | 124 | 122 | 126 |
| Elongation at break/% | 8 | 10 | 7 | 10 | — |
| Bending resistance/T | 1 | 0 | 1 | 0 | 4 |
| Curvature radius/mm | 1 | 0.5 | 1 | 0.5 | 20 |

Among them, the control system is the system without epoxy flexible chain modification. And the synthesis route is listed below:

(A) Synthesis of Epoxy Acrylate 1036.48 g of o-cresol epoxy resin, 4.9 g of triphenylphosphine (TPP) and 0.8 g of p-hydroxyanisole were added into a 500 ml three port flask, and the temperature was raised to 95° C. Add 90 g acrylic acid, heat naturally, and heat up to 108° C. after exothermic treatment, and keep the temperature for 2 hours. Add a certain amount of acrylic acid and polymerization inhibitor, and heat up to 115° C. for 3 hours. Add a certain amount of acrylic acid and keep the temperature at 115° C. until the end acid value is less than 1;

(B) Synthesis of Carboxylated Epoxy Acrylate (Anhydride Modified Epoxy Acrylate)

Add 199 g high boiling point solvent to mixed binary ester (DBE) and cool to 95° C. 1.04 g of polymerization inhibitor p-hydroxyanisole and 267.46 g of tetrahydrophthalic anhydride were added into a 500 ml three neck flask and kept at 100° C. for 2 hours. Then the temperature was raised to 108° C. until the end acid value was 4;

The TGA diagram of EATC with different cardanol glycidyl ether content was compared. It can be seen from FIG. 5 that with the increase of cardanol glycidyl ether content, the thermal decomposition temperature of the cured film almost did not change, that is, the heat before and after the modification. The stability of the system remained unchanged, indicating that the system still had good thermal resistance.

It can be seen from the results in Table 2 and FIG. 5 that the epoxy flexible segment modified epoxy acrylate synthesized by the invention has excellent mechanical and service properties. The prepared coating maintains the excellent mechanical strength, adhesion and heat resistance of the system, i.e. the hardness is very high, and the glass transition temperature and thermal degradation temperature hardly change. In addition, the flexibility of the system has been improved, that is, elongation at break, impact strength, bending resistance and bending radius of curvature are enhanced.

Example 6 Solder Resist

1. Preparation Method

Solder resist: prepare solder resist according to the formula shown in Table 3 and apply it to printed circuit board by screen printing. Then, the hot air circulation drying oven is used for drying to form the film of the solder resist composition. Furthermore, UV exposure machine is used for exposure development, and the performance comparison is shown in Table 4.

Table 3 solder resist formulation

| Component | Modified epoxy acrylates | Filler | Diluent | Photoinitiator | Auxiliaries |
|---|---|---|---|---|---|
| Content (wt %) | 50 | 40 | 6 | 3 | 1 |

2. Performance Test of Solder Resist Ink Coating

1. Water Resistance

After reaching the specified test time, the water resistance of the film is expressed by the surface change of the film, including immersion test and boiling water test. "+" indicates that there is no obvious change in appearance, "0" indicates a small part of the film is moistened, and "−" indicates that most of the film is moistened.

2. Acid Resistance Test

Immerse the above evaluation substrate in 10% sulfuric acid solution at 20° C. for 30 minutes, and then take it out to comprehensively determine the state and adhesion of the evaluation film. The judgment criteria are as follows:

+: no change found, 0: only a little change, −: swelling or shedding of the coating 3. Alkali Resistance Test In addition to changing 10 vol % sulfuric acid solution to 10 vol % sodium hydroxide solution, the other evaluation substrates are evaluated by the same method as acid resistance test.

4. Developing Property

The compositions of the above examples 1 to 4 are coated on the copper foil with a coater, heated at 80° C. for 20 minutes and dried. The obtained substrate is immersed in 1% sodium carbonate aqueous solution, and its dissolution is measured within 30 minutes. "+" indicates film can be completely removed and can be developed, "0" indicates that there is a little residual in the undeveloped part, and "−" indicates that there is more residual in the undeveloped part.

5. Solvent Resistance

The test substrate is prepared under the same conditions as the above 2 tightness tests. Wipe the film with acetone wet cloth for 10 times, and visually evaluate the change of the film. The evaluation criteria are as follows: + represents no visible change, 0 represents slight change, and − represents about half of the film dissolves.

6. Insulation Test

The dielectric constant is measured by Hewlett Packard 4291a instrument. The sample area is 50*50 mm and the thickness is 10 mm 7. Thixotropy Test The viscosity of the mixed ink formula was tested by a rotary viscometer. The test temperature was kept at 25° C. and the thixotropic value was equal to the viscosity of the ink at 50 rpm/the viscosity at 5 rpm.

8. Fineness Test

Hold the scraper with both hands so that the scraper is in vertical contact with the surface of the polished plate. In 1-2 seconds, pull the scraper from the deep part of the groove to the shallow part, so that the paint sample is full of the groove, and there is no residual paint on the plate. After the scraper has been pulled, it should be adjusted within 3 seconds. The line of sight is at an angle of 20-30° with the groove plane. Observe the dense particles in the sample first by light. Under the specified test conditions, the reading obtained on the standard fineness meter indicates the depth of the fineness meter groove, and the protruding solid particles in the measured product can be clearly observed here.

9. Sagging Test

According to the national standard GB/T9264-88 "determination of paint sagging property", the sagging property of colored paint is measured by sagging tester. The film thickness of the film placed vertically and does not flow to the next thickness is the value without sagging. The larger the thickness value, the less prone to sagging. The test condition is baking at 75° C. for 30 min to test the sagging performance.

10. Resolution Measurement

The mixed ink was screen printed and pre baked in 75° C. oven for 45 min. After that, the best resolution was observed by developing with 30° C. alkali solution for 60 s 11. Thermal Resistance Test The thermal resistance test is to put the plate in the tin melt at 288° C. for 10 s and test for three times. Take out the plate and dry it to test the heat resistance. Observe whether there is color turning yellow or bubbles on the surface, or conduct pull-out test with tape. If it is qualified, mark it as OK.

12. Dryness Test

The printed ink plate is placed in the 75° C. oven, baked for 20 minutes, then taken out and cooled to room temperature. Observe whether the surface is dry. If it is qualified, it is marked as OK.

13. Adhesion Test

Divide the developed ink coating film with a blade into a small square of 5*5 with a spacing of 1 mm, and the cutting mark shall penetrate the paint film to the substrate. Tear and pull it with 3M tape, and observe the paint film falling off with magnifying glass. If the paint film does not fall off the square, it is qualified. According to the area of paint film falling off, the adhesion is compared.

14. Sensitivity Test

After pre-drying for 45 min, the film was exposed at 600 mJ UV energy, and the film with different transparency was used to cover and observe the position of curing.

15. Hardness Test

Press the developed ink coating on the corresponding coating with a pencil grinded with the tip at an angle of about 45° and record the hardness of the pencil without film peeling.

TABLE 4 performance comparison of solder resist ink coatings

| | Example 1 | Example 2 | Example 3 | Example 4 | Control |
|---|---|---|---|---|---|
| Water resistance | + | + | + | + | + |
| Acid resistance | + | + | + | + | + |
| Alkali resistance | 0 | 0 | 0 | 0 | 0 |

TABLE 4-continued performance comparison of solder resist ink coatings

| | Example 1 | Example 2 | Example 3 | Example 4 | Control |
|---|---|---|---|---|---|
| Developing property | + | + | + | + | + |
| Solvent resistance | + | + | + | + | + |
| Thixotropy value | 3.79 | 3.81 | 3.82 | 3.81 | 3.83 |
| Finess (μm) | <5 | <5 | <5 | <5 | <5 |
| Sagging property | OK | OK | OK | One line merge | two lines merge |
| Resolution (μm) | 50 | 75 | 50 | 50 | 100 |
| Thermal resistance | OK | OK | OK | OK | OK |
| Dryness | OK | OK | OK | OK | OK |
| Adhesion/grade | 0 | 0 | 0 | 0 | 0 |
| Sensitivity | 11 | 11 | 11 | 11 | 11 |
| Hardness | >8H | >8H | >8H | >8H | >8H |

Among them, the modified epoxy acrylate used in the control group is consistent with that in Table 2.

As shown in Table 4, it represents the performance comparison of solder resist products prepared by adding the synthesized resin (modified epoxy acrylate) into the ink system. It can be seen from table 4 that the prepared solder resist inks have excellent water resistance, solvent resistance, acid resistance, development property and good insulation compared with the control group. In addition, the thixotropy value of the modified system increases, which makes the system have better sagging performance, and the fineness and dryness of the system meet the use requirements. Compared with the control group, the cured solder resist maintains excellent heat resistance, adhesion, hardness and other properties. At the same time, due to the increase of flexibility of the system, the solder resist resolution has been improved to a certain extent.

Although the invention has been disclosed as above in better examples, it is not used to limit the invention. Anyone who is familiar with the technology can make various modifications and modifications without departing from the spirit and scope of the invention. Therefore, the scope of protection of the invention shall be subject to the definition of the claims.

What is claimed is:

1. A modified epoxy acrylate represented by a formula as follows:

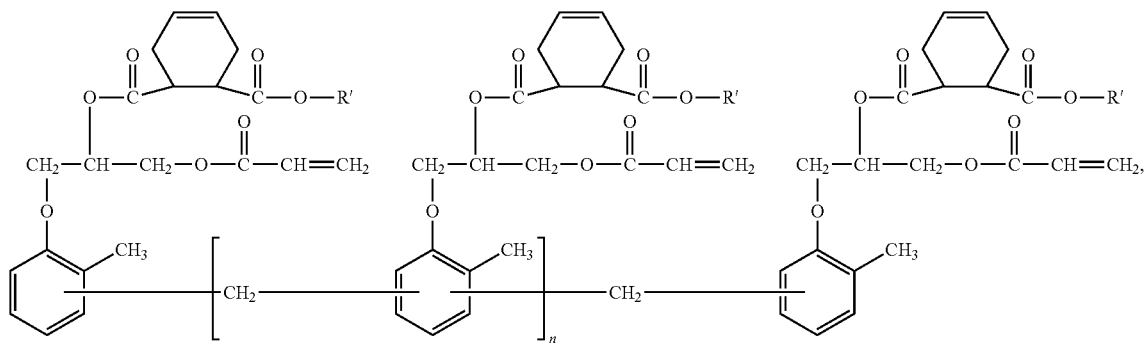

wherein n is 0~4,

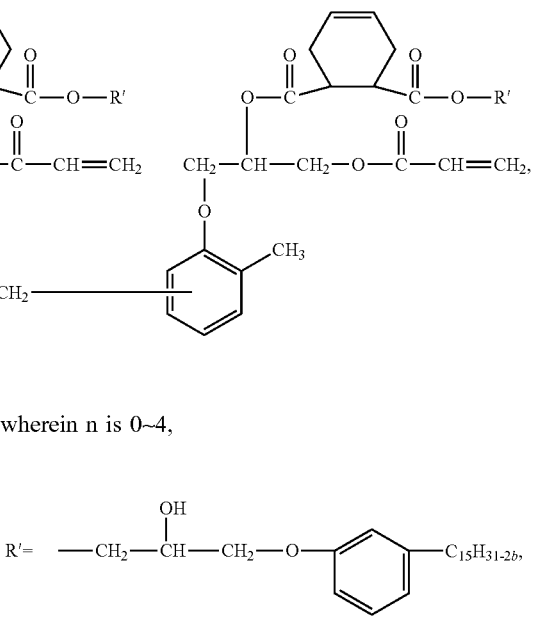

wherein b is 0, 1, 2 or 3 so that $-C_{15}H_{31-2b}$ is one of the following:

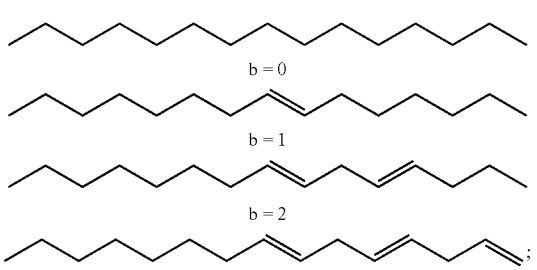

or

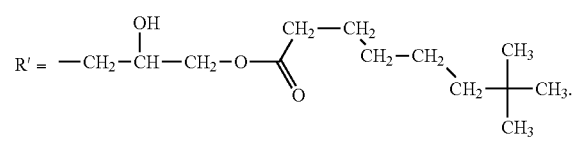

2. A solder resist comprising the modified epoxy acrylate of claim 1.

3. The solder resist according to claim 2, further comprising a photopolymerization initiator, a diluent, an auxiliary agent, and a filler.

4. A photocureable coating comprising the modified epoxy acrylate of claim 1.

5. An adhesive comprising the modified epoxy acrylate of claim 1.

6. A photoresist comprising the modified epoxy acrylate of claim 1.

7. A paint comprising the modified epoxy acrylate of claim 1.

8. A printed circuit board comprising the modified epoxy acrylate of claim 1.

* * * * *